(12) United States Patent
Son et al.

(10) Patent No.: US 10,748,707 B2
(45) Date of Patent: Aug. 18, 2020

(54) ELECTRONIC COMPONENT

(71) Applicant: SAMSUNG ELECTRO-MECHANICS CO., LTD., Suwon-si, Gyeonggi-do (KR)

(72) Inventors: Soo Hwan Son, Suwon-si (KR); Ho Yoon Kim, Suwon-si (KR); Sang Soo Park, Suwon-si (KR); Woo Chul Shin, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 53 days.

(21) Appl. No.: 16/212,567

(22) Filed: Dec. 6, 2018

(65) Prior Publication Data

US 2020/0126720 A1   Apr. 23, 2020

(30) Foreign Application Priority Data

Oct. 19, 2018   (KR) .......................... 10-2018-0124872

(51) Int. Cl.
| | |
|---|---|
| *H01G 4/002* | (2006.01) |
| *H01G 4/30* | (2006.01) |
| *H01G 4/248* | (2006.01) |
| *H01G 4/224* | (2006.01) |
| *H01G 4/232* | (2006.01) |
| *H01G 4/012* | (2006.01) |
| *H01G 4/12* | (2006.01) |
| *H01G 4/008* | (2006.01) |

(52) U.S. Cl.
CPC ............ *H01G 4/002* (2013.01); *H01G 4/224* (2013.01); *H01G 4/2325* (2013.01); *H01G 4/248* (2013.01); *H01G 4/30* (2013.01); *H01G 4/008* (2013.01); *H01G 4/012* (2013.01); *H01G 4/1227* (2013.01); *H01G 4/1245* (2013.01)

(58) Field of Classification Search
CPC ...... H01G 4/002; H01G 4/224; H01G 4/2325; H01G 4/248; H01G 4/30; H01G 4/008; H01G 4/012; H01G 4/1227; H01G 4/1245
See application file for complete search history.

(56) References Cited

U.S. PATENT DOCUMENTS

| | | | | |
|---|---|---|---|---|
| 2016/0205769 A1* | 7/2016 | Park | ..................... | H01G 4/224 174/260 |
| 2016/0309578 A1* | 10/2016 | Park | ..................... | H01G 4/248 |

FOREIGN PATENT DOCUMENTS

KR   10-2016-0085547 A   7/2016

\* cited by examiner

*Primary Examiner* — Michael P McFadden
(74) *Attorney, Agent, or Firm* — Morgan, Lewis & Bockius LLP

(57) ABSTRACT

An electronic component includes a multilayer capacitor including a capacitor body, and an external electrode disposed on an external surface of the capacitor body, an interposer including an interposer body, and an external terminals disposed on an external surface of the interposer body, and an encapsulation portion disposed to cover the multilayer capacitor. The external terminal includes a bonding portion disposed on a first surface of the interposer body to be electrically connected to the external electrode, a mounting portion disposed on a second surface of the interposer opposing the first surface, and a connection portion disposed on an end surface of the interposer to electrically connect the bonding portion to the mounting portion. A thickness of the encapsulation portion is within a range from 0.001 to 0.01 of a length of the electronic component.

11 Claims, 6 Drawing Sheets

ELECTRONIC COMPONENT

CROSS-REFERENCE TO RELATED APPLICATION(S)

This application claims the benefit of priority to Korean Patent Application No. 10-2018-0124872 filed on Oct. 19, 2018 in the Korean Intellectual Property Office, the disclosure of which is incorporated herein by reference in its entirety.

TECHNICAL FIELD

The present disclosure relates to an electronic component.

BACKGROUND

A multilayer capacitor has been used as a component of various electronic devices due to advantages thereof such as compactness and high capacitance.

Such a multilayer capacitor may include a plurality of dielectric layers and internal electrodes having different polarities disposed with each of the dielectric layers interposed therebetween.

In this case, the dielectric layers have piezoelectric properties. Accordingly, when a direct current (DC) voltage or an alternating current (AC) voltage is applied to the multilayer capacitor, a piezoelectric phenomenon may occur between the internal electrodes. As a result, the volume of a ceramic body is expanded and contracted, depending on a frequency, to cause periodic vibrations.

The vibrations may be transmitted to the board through a solder connecting external electrodes of the multilayer ceramic capacitor to a board. Thus, the entire board may become an acoustic reflective surface to generate a vibration sound to be a noise.

The vibration sound may be in an audible frequency region of 20 Hz to 20,000 Hz, causing listener discomfort. The vibration sound causing listener discomfort is referred to as an acoustic noise.

An electronic component using an interposer disposed between a multilayer capacitor and a board is disclosed as a method of reducing such an acoustic noise.

However, in the case of an electronic component using an interposer, according to a related art, an acoustic-noise reduction effect may not be as significant as expected, or fixing strength between a multilayer capacitor and a metal frame may not be sufficiently secured. Thus, poor mounting may occur during board mounting.

In addition, when external humidity or the like permeates into a multilayer capacitor through a capacitor body, reliability of a product may be degraded.

Accordingly, there is need for a technique to secure fixing strength and reliability while effectively reducing acoustic noise of an electronic component.

SUMMARY

An aspect of the present disclosure may provide an electronic component having fixing strength between a multilayer capacitor and a metal frame and securing humidity resistance reliability, while maintaining an acoustic-noise reduction effect of a certain level or higher.

According to an aspect of the present disclosure, an electronic component includes a multilayer capacitor including a capacitor body, and an external electrode disposed on an external surface of the capacitor body, an interposer including an interposer body, and an external terminal disposed on an external surface of the interposer body, and an encapsulation portion disposed to cover the multilayer capacitor. The external terminal includes a bonding portion disposed on a first surface of the interposer body to be electrically connected to the external electrode, a mounting portion disposed on a second surface of the interposer opposing the first surface, and a connection portion disposed on an end surface of the interposer to electrically connect the bonding portion and the mounting portion to each other. A thickness of the encapsulation portion is within a range from 0.001 to 0.01 of a length of the electronic component.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
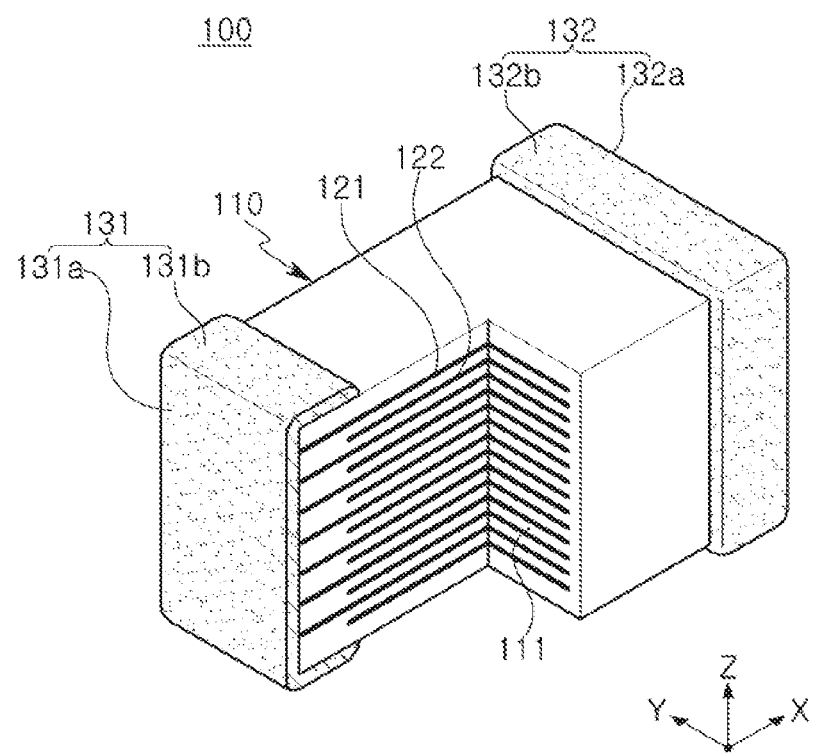
FIG. 1 is a partially cutaway perspective view illustrating an exemplary embodiment of a multilayer capacitor applied to the present disclosure.

Hereinafter, embodiments of the present disclosure will be described as follows with reference to the attached drawings.

The present disclosure may, however, be embodied in many different forms and should not be construed as being limited to the embodiments set forth herein.

Rather, these embodiments are provided so that this disclosure will be thorough and complete, and will fully convey the scope of the preset disclosure to those skilled in the art.

In the drawings, the shapes and dimensions of elements may be exaggerated for clarity.

The same reference numerals will be used throughout to designate the same or like elements.

Terms used in the present specification are for explaining the embodiments rather than limiting the present disclosure. Unless explicitly described to the contrary, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

In the specification, directions will be defined to clearly describe exemplary embodiments in the present disclosure. In drawings, X, Y, and Z will denote a length direction, a width direction, and a thickness direction of a multilayer capacitor and an interposer, respectively.

In exemplary embodiments, the Z direction may be used to have the same concept as a direction in which a dielectric layer is laminated.

Figure 2A:
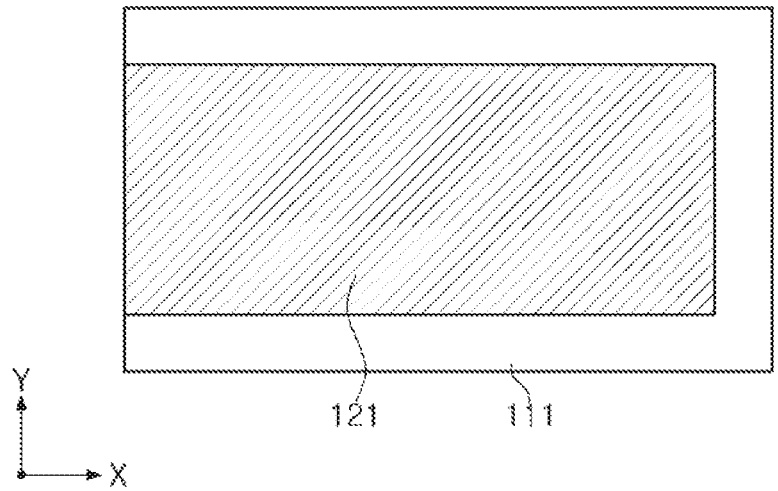
FIGS. 2A and 2B are plan views of first and second internal electrodes of the multilayer capacitor in FIG. 1.
Figure 2B:
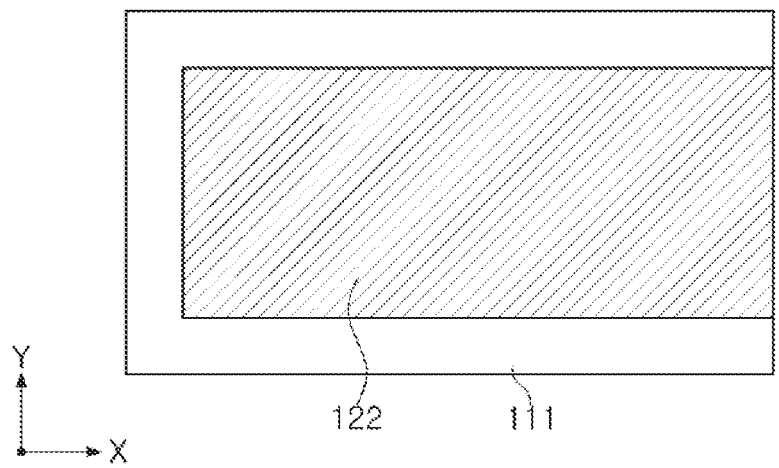

FIG. 1 is a partially cutaway perspective view illustrating an exemplary embodiment of a multilayer capacitor applied to the present disclosure, and FIGS. 2A and 2B are plan views of first and second internal electrodes of the multilayer capacitor in FIG. 1.

Hereinafter, a structure of a multilayer capacitor applied to an electronic component of the present embodiment will be described with reference to FIGS. 1 to 2B.

A multilayer capacitor 100 according to the present embodiment includes a capacitor body 110 and first and second external electrodes 131 and 132, disposed on external surfaces of the capacitor body 110 in an X direction, respectively.

The capacitor body 110 is formed by laminating a plurality of dielectric layers 111 in a Z direction and sintering the laminated dielectric layers 111. Adjacent dielectric layers 111 of the capacitor body 110 may be integrated with each other so that boundaries therebetween are not readily apparent without using a scanning electron microscope (SEM).

In addition, the capacitor body 110 includes first and second internal electrodes 121 and 122 having polarities different from each other. The first and second electrodes 121 and 122 are alternately disposed with each of the dielectric layers 111 interposed therebetween in the Z direction.

The capacitor body 110 may include an active region, as a portion contributing to formation of capacitance of the multilayer capacitor 110, and cover regions 112 and 113, as margin portions prepared in both side portions of the capacitor body 111 in a Y direction and prepared in upper and lower portions of the active region in the Z direction.

The capacitor body 110 is not limited in shape, but may have a hexahedral shape. The capacitor body 110 may have first and second surfaces 1 and 2 disposed to oppose each other in the Z direction, third and fourth surfaces 3 and 4 connected to the first and second surfaces 1 and 2 and disposed to oppose each other in the X direction, and fifth and sixth surfaces 5 and 6 connected to the first and second surfaces 1 and 2 as well as the third and fourth surfaces 3 and 4 and disposed to oppose each other.

The dielectric layer 111 may contain ceramic powder particles, for example, barium titanate ($BaTiO_3$)-based ceramic powder particles or the like.

The $BaTiO_3$-based ceramic powder particles may be $(Ba_{1-x}Ca_x)TiO_3$, $Ba(Ti_{1-y}Ca_y)O_3$, $(Ba_{1-x}Ca_x)(Ti_{1-y}Zr_y)O_3$, or $Ba(Ti_{1-y}Zr_y)O_3$ in which calcium (Ca) or zirconium (Zr) is partially employed in $BaTiO_3$, but a material of the ceramic powder is not limited thereto.

In addition to the ceramic powder particles, ceramic additives, organic solvents, plasticizers, binders, dispersing agents, and the like may be further added to the dielectric layer 111.

The ceramic additives may include, for example, a transition metal oxide or a transition metal carbide, a rare earth element, magnesium (Mg), aluminum (Al), or the like.

The first and second internal electrodes 121 and 122, as electrodes applied with polarities different from each other, may be disposed on the dielectric layers 111 to be laminated in the Z direction. The first and second internal electrodes 121 and 122 may be alternately disposed to oppose each other with each of dielectric layers 111 interposed therebetween in the capacitor body 110 in the Y direction.

In this case, the first and second internal electrodes 121 and 122 may be electrically insulated from each other by the dielectric layer 111 disposed in the middle thereof.

While a structure in which internal electrodes are laminated in the Z direction has been described in the present disclosure, a structure of the multilayer capacitor 100 is not limited thereto. If necessary, the present disclosure may be applied to a structure in which internal electrodes are laminated in the Y direction.

One ends of the first and second internal electrodes 121 and 122 maybe exposed through the third and fourth surfaces 3 and 4 of the capacitor body 110, respectively.

End portions of the first and second electrodes 121 and 122 alternately exposed through the third and fourth surfaces 3 and 4 of the capacitor body 110 may be connected to the first and second external electrodes 131 and 132 disposed on both end portions of the capacitor body 110 in the X direction, which will be described later, to be electrically connected thereto, respectively.

According to the above-described configuration, charges are accumulated between the first and second internal electrodes 121 and 122 when a predetermined voltage is applied to the first and second external electrodes 131 and 132.

In this case, capacitance of the multilayer capacitor 100 may be proportional to an overlapping area between the first and second internal electrodes 121 and 122 overlapping each other in the active region in the Y direction.

A material for forming the first and second internal electrodes 121 and 122 is not limited. For example, the first and second internal electrodes 121 and 122 may be formed using a conductive paste formed of at least one of a noble metal material such as platinum (Pt), palladium (Pd), and a palladium-silver (Pd—Ag) alloy, and the like, nickel (Ni), and copper (Cu).

The conductive paste maybe printed by means of a screen printing method, a gravure printing method, or the like, but the printing method is not limited thereto.

The first and second external electrodes 131 and 132 may be provided with voltages having polarities different from each other and may be disposed on both end portions of the capacitor body 110 in the X direction. The first and second external electrodes 131 and 132 may be connected to exposed end portions of the first and second internal electrodes 121 and 122, respectively, to be electrically connected to each other.

The first external electrode 131 may include a first head portion 131a and a first band portion 131b.

The first band portion 131a is disposed on the third surface 3 of the capacitor body 110 and is in contact with an end portion exposed outwardly of the first internal electrode 121 through the third surface 3 of the capacitor body 110 to electrically connect the first internal electrode 121 to the first external electrode 131.

The first band portion 131b is a portion extending from the first head portion 131a to portions of the first, second, fifth, and sixth surfaces 1, 2, 5, and 6 of the capacitor body 110 to improve fixing strength or the like.

In this case, the first band portion 131b may further extend from the first head portion 131a to the second, fifth, and sixth surfaces 2, 5, and 6 of the capacitor body 110 to improve fixing strength or the like.

The second external electrode 132 may include a second head portion 132a and a second band portion 132b.

The second head portion 132a is disposed on the fourth surface 4 of the capacitor body 110 and is in contact with an end portion exposed outwardly of the second internal electrode 122 through the fourth surface 4 of the capacitor body 110 to electrically connect the second internal electrode 122 to the second external electrode 132.

The second band portion 132b is a portion extending from the head portion 132a to a portion of the first surface 1 of the capacitor body 110.

In this case, the second band portion 132b may further extend from the head portion 132a to portions of the second, fifth, and sixth surfaces 2, 5, and 6 of the capacitor body 110 to improve fixing strength or the like.

The first and second external electrodes 131 and 132 may further include a plating layer.

The plating layer may include first and second nickel (Ni) plating layers and first and second tin (Sn) plating layers covering the first and second nickel plating layers, respectively.

Figure 3:
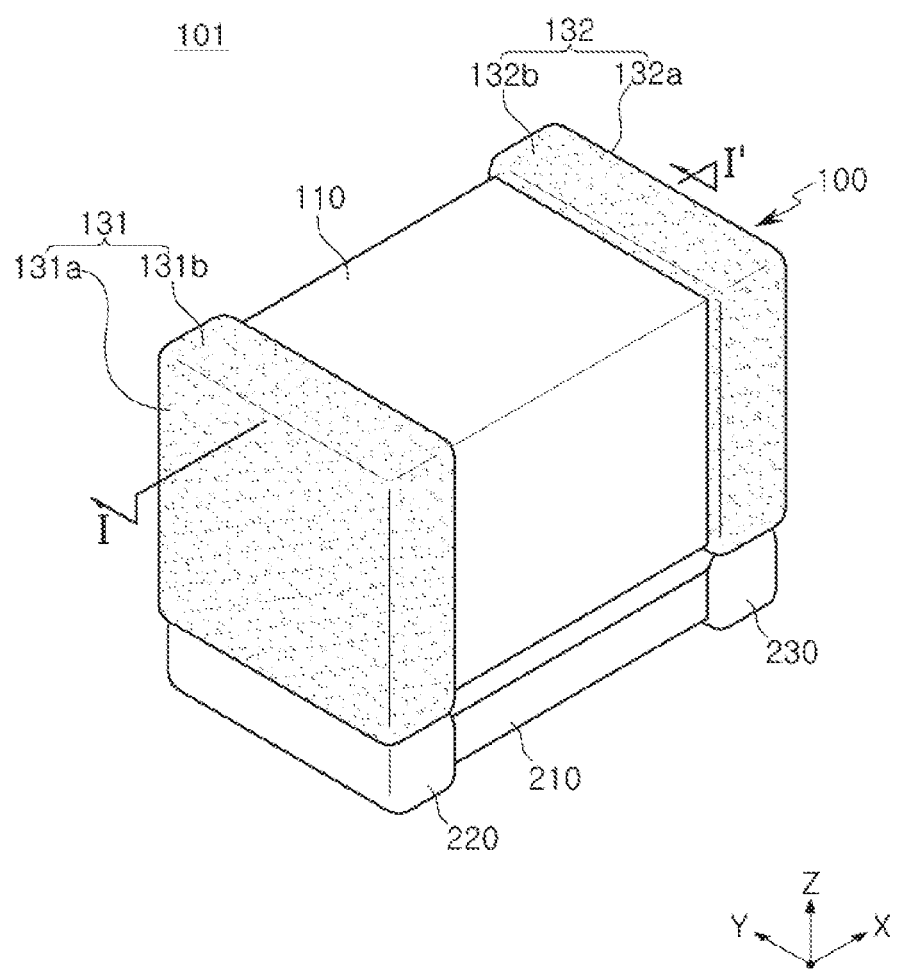
FIG. 3 is a perspective view illustrating a state in which a multilayer capacitor and an interposer are coupled to each other.
Figure 4:
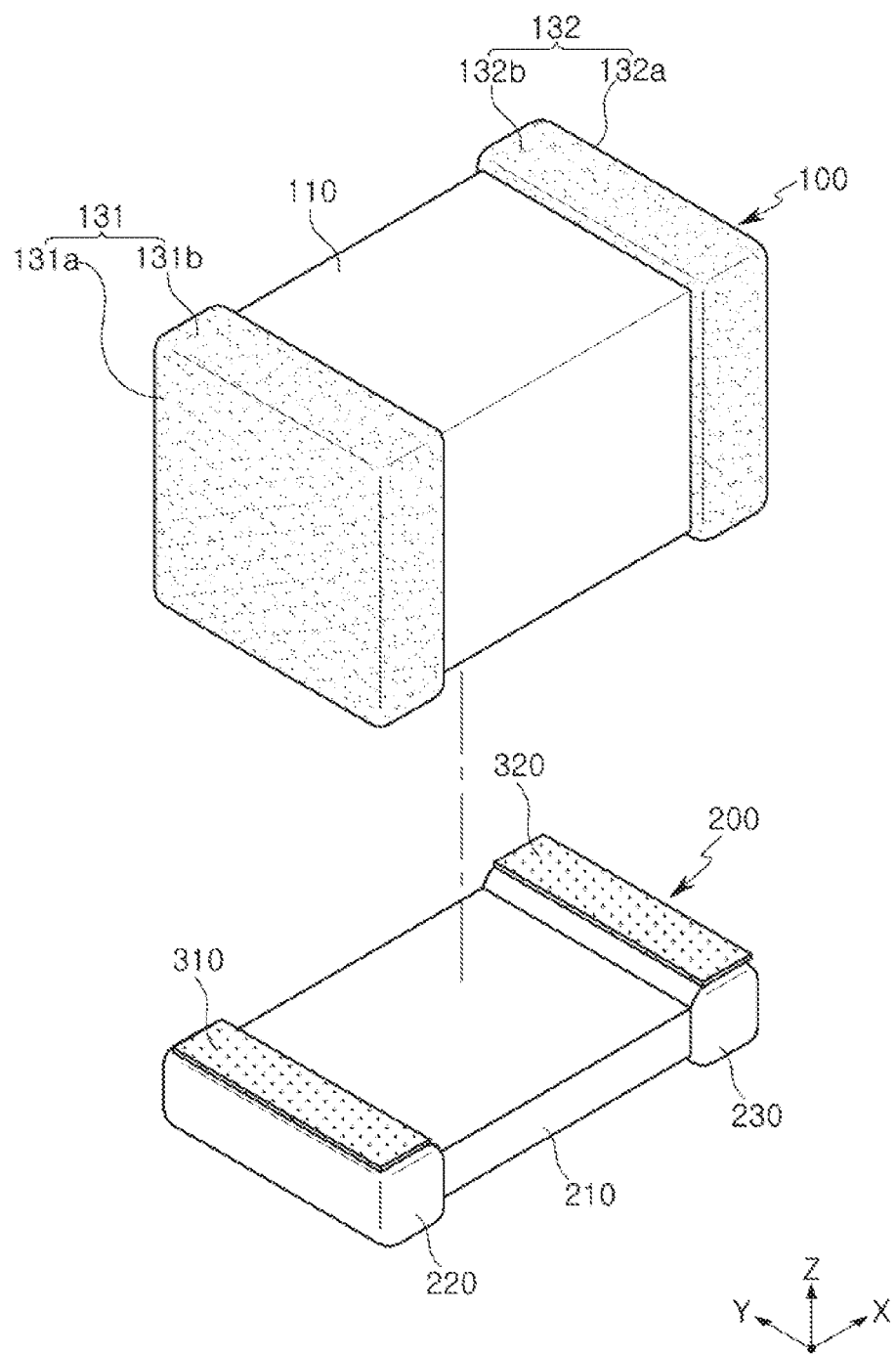
FIG. 4 is an exploded perspective view of FIG. 3.
Figure 5:
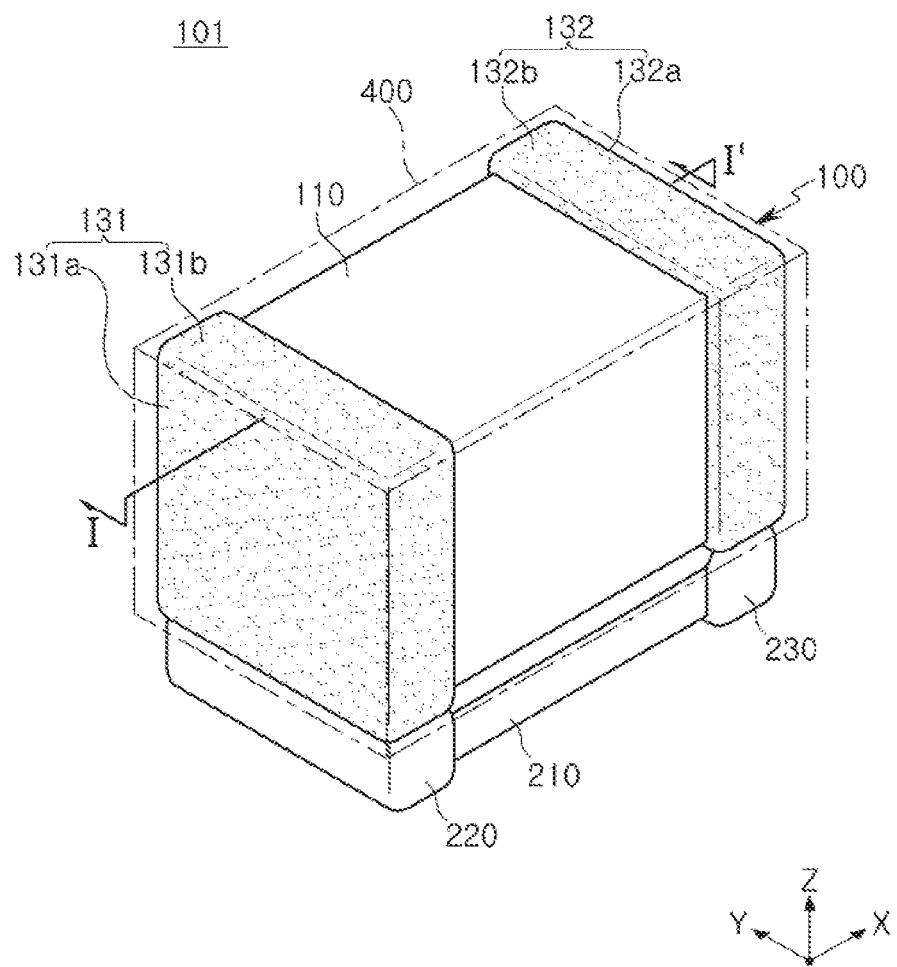
FIG. 5 is a perspective view of an electronic component according to an exemplary embodiment in the present disclosure.

FIG. 3 is a perspective view illustrating a state in which a multilayer capacitor and an interposer are coupled to each other, and FIG. 4 is an exploded perspective view of FIG. 3. FIG. 5 is a perspective view of an electronic component according to an exemplary embodiment in the present disclosure, and FIG. 6 is a cross-sectional view taken along line I-I' in FIG. 5.

Figure 6:
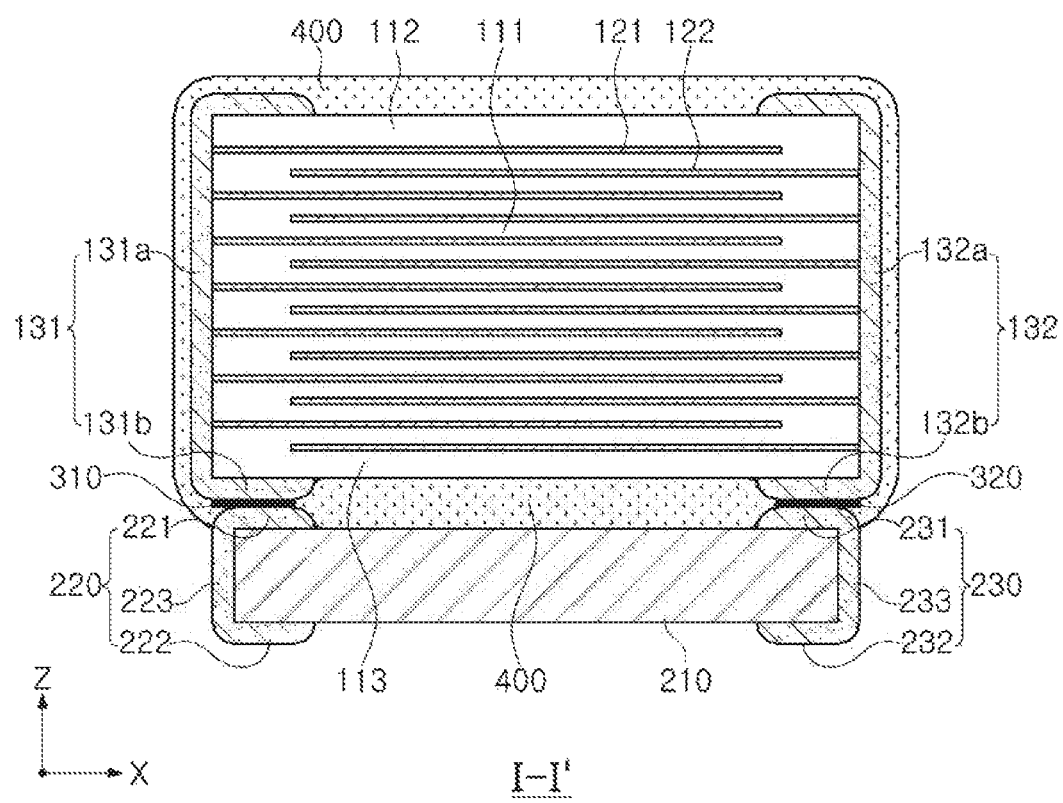
FIG. 6 is a cross-sectional view taken along line I-I' in FIG. 5.

Referring to FIGS. 3 and 6, an electronic component 101 according to the present embodiment includes a multilayer capacitor 100, an interposer 200, and an encapsulation portion 400.

The interposer 200 includes an interposer body 210 and first and second external terminals 220 and 230, disposed on both end portions of the interposer body 210 in an X direction, respectively.

The interposer body 210 may be formed of a ceramic material. In detail, the interposer body 210 may be formed of alumina.

The interposer body 210 maybe provided in such a manner that a length of the interposer body 210 in the X direction and a width of the interposer body 210 in the Y direction are less than a length of the capacitor body 110 in the X direction and a width of the capacitor body 110 in the Y direction, respectively.

The first and second external terminals 220 and 230 may be provided with voltages having polarities opposite to each other, and may be connected to the first and second band portions 131b and 132b of the first and second external electrodes 131 and 132 to be electrically connected to each other, respectively.

The external terminal 220 includes a first bonding portion 221, a first mounting portion 222, and a first connection portion 223.

The first bonding portion 221 is disposed on a top surface of the interposer body 210 and has one end exposed through one surface of the interposer body 210 in the X direction and connected to the first band portion 131b of the first external electrode 131.

The first mounting portion 222 is disposed on a bottom surface of the interposer body 210 to face the first boding portion 221 in the Z direction and may serve as a terminal during board mounting.

In this case, a first conductive adhesive layer 310 may be provided between the first boding portion 221 and the second band portion 132b to bond the first boding portion 221 and the second band portion 132b to each other.

The first conductive adhesive layer 310 may be formed of a high-temperature solder, a conductive adhesive, or the like.

The first mounting portion 222 is disposed on a bottom surface of the interposer body 210 to face the first boding portion 221 in the Z direction and may serve as a terminal during board mounting.

The first connection portion 223 may be disposed is disposed on one end surface of the interposer body 210 in the X direction and serves to connect an end portion of the first bonding portion 221 and an end portion of the first mounting portion 222 to each other.

Accordingly, the first external terminal 220 may be disposed to have a [-shaped X-Z end surface.

The second external terminal 230 includes a second bonding portion 231, a second mounting portion 232, and a second connection portion 233.

The second bonding portion 231 is disposed on a top surface of the interposer body 210 and has an end exposed through the other surface of the interposer body 210 in the X direction and connected to the second band portion 132b of the second external electrode 132.

In this case, a second conductive adhesive layer 320 may be provided between the second bonding portion 231 and the second band portion 132b to bond the second bonding portion 231 and the second band portion 132b to each other.

The second conductive adhesive layer 320 may be formed of a high-temperature solder, a conductive adhesive, or the like.

The second mounting portion 232 may be disposed on the bottom surface of the interposer body 210 to face the second bonding portion 232 in the Z direction and may serve as a terminal during board mounting.

The second connection portion 233 is disposed on the other end surface of the interposer body 210 in the X direction and serves to connect an end portion of the second bonding portion 231 to an end portion of the second mounting portion 232.

Accordingly, the first external terminal 220 may be disposed to have a ]-shaped X-Z end surface.

A plating layer may be further provided respectively between surfaces of the first and second external terminals 220 and 230.

The plating layer may include a nickel plating layer and a tin plating layer covering the nickel plating layer.

The encapsulation portion 400 covers the multilayer capacitor 100.

In this case, the encapsulation portion 400 may further cover a top surface of the interposer 200 and the first and second conductive adhesive layers 310 and 320. The encapsulation portion 400 may encapsulate the conductive adhesive layers 310 and 320 and be in direct contact with the first and second external terminals 220 and 230.

The encapsulation portion 400 may be formed of an organic or inorganic material having a certain level of strength and humidity resistance. For example, the organic material may be at least one of epoxy and urethane, and the inorganic material may be at least one of silicon oxide ($SiO_2$) and titanium oxide ($TiO_2$).

A thickness of the encapsulation portion 400 may be 0.001 to 0.01 of a length of the electronic component 101. In more detail, the thickness of the encapsulation portion 400 may be 0.003 to 0.006 of a length of the electronic component 101.

When the thickness of the encapsulation portion 400 is greater than 0.01 of the length of the electronic component 101, acoustic noise may be increased. When the thickness of the encapsulation portion 400 is less than 0.001 of the length of the electronic component 101, fixing strength and humidity resistance may be reduced.

When voltages having different polarities are applied to the first and second external electrodes 131 and 132 disposed in the electronic component 100 while the electronic component 100 is mounted on a board, the capacitor body 110 is expanded and contracted in the Z direction by an inverse piezoelectric effect of the dielectric layer 111.

Accordingly, both end portions of the first and second external electrodes 131 and 132 are expanded and contracted by the Poisson effect in contrast to expansion and contraction in the Z direction of the capacitor body 110.

The expansion and contraction result in the generation of vibrations.

The vibrations are transferred to the board through the first and second external electrodes 131 and 132 and the first and second external terminals 220 and 230. Accordingly, an acoustic sound is radiated from the board to cause acoustic noise.

In the present embodiment, the interposer 200 is attached to a first surface side that is a direction in which the multilayer capacitor 100 is mounted, serving to prevent the vibrations of the multilayer capacitor 100 from being transferred to the board. Accordingly, the interposer 200 may reduce the acoustic noise of the multilayer capacitor 100.

Some electronic components using an interposer for reducing such acoustic noise have been proposed.

However, in the case of an electronic component using an interposer according to a related art, an acoustic noise reduction effect is not as high as expected or poor mounting occurs during board mounting because fixing strength is not secured.

Moreover, when external humidity or the like permeates through a capacitor body of a multilayer capacitor, reliability of a product may be degraded.

Accordingly, there is a need for a technique to further reduce acoustic noise and secure fixing strength and reliability.

In the present embodiment, a multilayer capacitor may be encapsulated by an encapsulation portion to further reduce vibrations transferred from the multilayer capacitor to a board. As a result, acoustic noise may be further reduced.

The encapsulation portion may increase fixing strength between the multilayer capacitor and the interposer.

In addition, the encapsulation portion suppresses permutation of foreign substances, such as external humidity and the like, to the capacitor body to improve humidity resistance reliability of a product.

EXPERIMENTAL EXAMPLE

Table (1) and Table (2) numerically illustrate acoustic noise, humidity resistance reliability, and fixing strength between a multilayer capacitor and an interposer of an electronic component, depending on a thickness of an encapsulation portion.

In Table (1), acoustic noise, humidity resistance reliability, and fixing strength between a multilayer capacitor and an interposer of an electronic component were measured by mounting a multilayer capacitor having a length of 1.6 mm and a width of 0.8 mm on an interposer, locating an encapsulation portion, and mounting an electronic component on a printed circuit board (PCB) using solders.

In this case, a thickness of the encapsulation portion changed from 0 micrometer (μm) to 18.9 μm.

By increasingly applying force to an X-Z surface of the electronic component mounted on the PCB, strength at the moment of separating the electronic component from the PCB was confirmed to determine whether the fixing strength was poor.

A humidity resistance test was performed at a temperature of 85 degrees Celsius, a humidity of 85% RH, and twice a rated voltage for 200 hours to measure the number of defective samples in a humidity resistance test, and the number of respective samples was 200.

TABLE (1)

| # | THICKNESS OF ENCAPSULATION PORTION (μm) | THICKNESS OF ENCAPSULATION PORTION/LENGTH OF ELECTRONIC COMPONENT | FIXING STRENGTH (N) | NUMBER OF POOR SAMPLES IN HUMIDITY RESISTANCE TEST (EA) | A/N (dBA) |
|---|---|---|---|---|---|
| 1 | 0 | 0 | 15.1 | 8 | 26 |
| 2 | 0.5 | 0.00031 | 17.0 | 5 | 25 |
| 3 | 1.2 | 0.00075 | 18.8 | 1 | 25 |
| 4 | 3.5 | 0.00218 | 22.0 | 0 | 26 |
| 5 | 6.2 | 0.00387 | 24.2 | 0 | 27 |
| 6 | 10.2 | 0.00637 | 25.0 | 0 | 30 |
| 7 | 18.9 | 0.01181 | 25.5 | 0 | 31 |

As can be seen from Table (1), as the thickness of the encapsulation portion increased, the fixing strength was increasingly improved.

In the case of Samples 1 to 3 in which a thickness of an encapsulation portion/a length of an electronic component was less than 0.001, one or more poor samples were obtained, respectively, in the humidity resistance test.

In the case of Sample 7 in which a thickness of an encapsulation portion/a length of an electronic component was greater than 0.01, no poor sample was obtained but acoustic noise was greater than 30 dBA.

Accordingly, a detailed range of the thickness of the encapsulation portion/the length of the electronic component, ensuring a certain level or less of acoustic noise and having improved humidity resistance reliability, may be 0.001 to 0.01.

In Table (2), acoustic noise, humidity resistance reliability, and fixing strength between a multilayer capacitor and an interposer of an electronic component were measured by mounting a multilayer capacitor having a length of 0.6 mm and a width of 0.3 mm on an interposer, locating an encapsulation portion, and mounting an electronic component on a printed circuit board (PCB) using solders.

In this case, a thickness of the encapsulation portion changed from 0 micrometer (μm) to 9.5 μm.

TABLE (2)

| # | THICKNESS OF ENCAPSULATION PORTION μm) | THICKNESS OF ENCAPSULATION PORTION/LENGTH OF ELECTRONIC COMPONENT | FIXING STRENGTH (N) | NUMBER OF POOR SAMPLES IN HUMIDITY RESISTANCE TEST (EA) | A/N (dBA) |
|---|---|---|---|---|---|
| 8 | 0 | 0 | 2.8 | 13 | 28 |
| 9 | 0.5 | 0.00083 | 3.1 | 4 | 28 |
| 10 | 1.8 | 0.00300 | 4.5 | 0 | 27 |
| 11 | 2.5 | 0.00416 | 6.2 | 0 | 27 |
| 12 | 3.5 | 0.00583 | 6.2 | 0 | 27 |
| 13 | 7.0 | 0.01166 | 6.3 | 0 | 31 |
| 14 | 9.5 | 0.01583 | 6.9 | 0 | 32 |

Referring to Table (2), in the case of Samples 8 and 9 in which a thickness of an encapsulation portion/a length of an electronic component is less than 0.001, one or more poor samples were obtained, respectively, in a humidity resistance test.

In the case of Samples 13 and 14 in which a thickness of an encapsulation portion/a length of an electronic component was greater than 0.01, no poor sample was obtained but acoustic noise was greater than 30 dBA.

Accordingly, a detailed range of the thickness of the encapsulation portion/the length of the electronic component, ensuring a certain level or less of acoustic noise and having improved humidity resistance reliability, may be 0.003 to 0.006.

As described above, according to an exemplary embodiment, fixing strength between a multilayer capacitor and a metal frame may be improved while maintaining an acoustic noise reduction effect of an electronic component of a certain level or higher. Thus, poor mounting may be prevented during board mounting and permeation of external humidity or the like may be prevented to secure humidity resistance reliability.

While exemplary embodiments have been shown and described above, it will be apparent to those skilled in the art that modifications and variations could be made without departing from the scope of the present invention as defined by the appended claims.

What is claimed is:

1. An electronic component comprising:
a multilayer capacitor including a capacitor body, and an external electrode disposed on an external surface of the capacitor body;
an interposer including an interposer body, and an external terminal disposed on an external surface of the interposer body; and
an encapsulation portion disposed to cover the multilayer capacitor,
wherein the external terminal includes a bonding portion disposed on a first surface of the interposer body and electrically connected to the external electrode, a mounting portion disposed on a second surface of the interposer opposing the first surface, and a connection portion disposed on an end surface of the interposer to electrically connect the bonding portion and the mounting portion to each other, and
wherein a thickness of the encapsulation portion is within a range from 0.001 to 0.01 of a length of the electronic component.

2. The electronic component of claim 1, wherein the thickness of the encapsulation portion is within a range from 0.003 to 0.006 of the length of the electronic component.

3. The electronic component of claim 1, further comprising:
a conductive adhesive layer disposed between the external electrode and the bonding portion.

4. The electronic component of claim 3, wherein the conductive adhesive layer includes a high-temperature solder.

5. The electronic component of claim 3, wherein the encapsulation portion encapsulates the conductive adhesive layer and is in direct contact with the external terminal.

6. The electronic component of claim 1, wherein the encapsulation portion includes at least one selected from the group of epoxy, urethane, silicon oxide ($SiO_2$), and titanium oxide ($TiO_2$).

7. The electronic component of claim 1, wherein the interposer body includes alumina.

8. The electronic component of claim 1, wherein the capacitor body has first and second surfaces disposed to oppose each other, third and fourth surfaces connected to the first and second surfaces and disposed to oppose each other, and fifth and sixth surfaces connected to the first and second surfaces as well as to the third and fourth surfaces and disposed to oppose each other, the capacitor body including a plurality of dielectric layers and a plurality of first and second internal electrodes alternately disposed, with each of the dielectric layers interposed therebetween, in a direction in which the first and second surfaces are connected, and
one ends of the first and second internal electrodes are exposed through the third and fourth surfaces, respectively.

9. The electronic component of claim 8, wherein the external electrode includes first and second external electrodes respectively including first and second head portions disposed on the third and fourth surfaces of the capacitor body to be electrically connected to the first and second internal electrodes, respectively, and first and second band portions extending from the first and second head portions to a portion of the first surface of the capacitor body, respectively.

10. The electronic component of claim 1, further comprising:
a plating layer disposed on an external surface of the external electrode and the external terminal.

11. The electronic component of claim 10, wherein the plating layer includes a nickel plating layer and a tin plating layer covering the nickel plating layer.

* * * * *